US006842011B1

(12) United States Patent
Page et al.

(10) Patent No.: US 6,842,011 B1
(45) Date of Patent: Jan. 11, 2005

(54) METHOD AND APPARATUS FOR LOCATING IMPEDANCE MISMATCHES IN A RADIO FREQUENCY COMMUNICATION SYSTEM

(75) Inventors: Trevor A. Page, Airdrie (CA); David M. Tholl, Calgary (CA); Gordon B. Neilson, Calgary (CA)

(73) Assignee: Nortel Networks Limited, Richardson, TX (US)

( * ) Notice: Subject to any disclaimer, the term of this patent is extended or adjusted under 35 U.S.C. 154(b) by 141 days.

(21) Appl. No.: 10/184,322

(22) Filed: Jun. 27, 2002

(51) Int. Cl.[7] ............................................. G01R 27/32
(52) U.S. Cl. ........................................ 324/637; 324/533
(58) Field of Search ................................ 324/637, 533, 324/627

(56) References Cited

U.S. PATENT DOCUMENTS

| 5,144,250 A | * | 9/1992 | Little | 324/533 |
| 5,751,149 A | * | 5/1998 | Oberg et al. | 324/533 |
| 6,104,287 A | * | 8/2000 | Meyer | 324/533 |
| 6,307,380 B1 | * | 10/2001 | Hirai et al. | 324/533 |

* cited by examiner

*Primary Examiner*—N. Le
*Assistant Examiner*—Timothy J. Dole
(74) *Attorney, Agent, or Firm*—Schwegman, Lundberg, Woessner & Kluth, P.A.

(57) ABSTRACT

A communication system uses a reflected signal to determine the location of an impedance mismatch along a transmission path. The system provides a forward signal through the transmission path, and obtains, using a feedback loop, forward signal samples and reflected signal samples from the forward signal and a reflected signal, respectively. Assuming a significant mismatch exists, the system identifies a time delay of any impedance mismatch from the forward signal samples and the reflected signal samples. The physical location of the mismatch along the transmission path is determined based on the time delay and a propagation velocity of the forward signal through the transmission path. The magnitude of the mismatch is determined based on a voltage gain calculation, a loss profile of the transmission path, the propagation velocity, and the time delay. In one embodiment, the method is carried out in a communications base station that includes an amplifier, a feedback loop, a feedback receiver, and a processor.

11 Claims, 10 Drawing Sheets

METHOD AND APPARATUS FOR LOCATING IMPEDANCE MISMATCHES IN A RADIO FREQUENCY COMMUNICATION SYSTEM

FIELD OF THE INVENTION

The present invention relates to radio frequency (RF) communication systems, and in particular to locating impedance mismatches along the transmit path of an RF communication system.

BACKGROUND OF THE INVENTION

Telecommunications base stations transmit and receive signals to and from remote communication devices, such as cellular telephones or radios. In order for the base station to transmit a signal, base-band data is up-converted and amplified by a power amplifier. RF output of the power amplifier is then filtered, and sent to a transmit antenna. Typically, the path between the transmit filter and the antenna includes various connectors and cables (e.g., 50 Ω RF antenna cable).

If the cables, connectors or other components of the transmit path are misconnected, damaged or otherwise faulty, it is likely that a mild to severe impedance mismatch will exist for the transmitted signal. This can result in a degraded or interrupted signal. Accordingly, when these mismatches are present, it is important to accurately determine the location and source of the problem.

In order to locate an impedance mismatch using prior art methods, a human operator is required to disconnect cables and connectors along the transmit path, and insert external test equipment to approximate the mismatch location. For example, an operator can manually insert a Time-Domain Reflectometer (TDR) along the transmit path. The TDR then sends out a signal along the transmit path, and measures the magnitude of any signal that is reflected back to the TDR. These measurements give an indication of the location of the impedance mismatch so that the problem can be corrected.

Because insertion of external equipment requires the operator to disconnect portions of the transmit path, one disadvantage to prior art systems is that it is necessary to interrupt normal transmissions in order to diagnose a problem. In addition, the external test equipment generally is expensive, and requires an operator to be trained and proficient at using the equipment.

There is a need to accurately estimate the locations of impedance mismatches along the transmit path of an RF communication system without interrupting normal transmissions. There is a further need to locate such impedance mismatches without the use of external test equipment

SUMMARY OF THE INVENTION

A communication system uses a reflected signal to determine the location of an impedance mismatch along a transmission path. The system provides a forward signal through the transmission path, and obtains, using a feedback loop, forward signal samples and reflected signal samples from the forward signal and a reflected signal, respectively. The system then identifies a time delay from the forward signal samples and the reflected signal samples. In one embodiment, the time delay is identified by applying a correlation function to the forward signal samples and the reflected signal samples, and determining a point where the correlation function exceeds a threshold value. In another embodiment, the forward signal is a discrete RF pulse provided through the transmission path, and the time delay is identified by determining a point where a magnitude of the reflected signal samples exceeds a threshold value.

The physical location of the impedance mismatch along the transmission path is determined, in one embodiment, from the time delay by calculating a voltage gain between the forward signal and the reflected signal at a point that corresponds to the time delay, and determining whether the voltage gain exceeds a nominal range of values. If the voltage gain exceeds the nominal range, the physical location is determined based on the time delay and a propagation velocity of the forward signal through the transmission path. The magnitude of the impedance mismatch is determined, in a further embodiment, based on the voltage gain, a loss profile of the transmission path, the propagation velocity, and the time delay.

In one embodiment, the method is carried out in an apparatus that includes an amplifier, a feedback loop, a feedback receiver, and a processor. The amplifier transmits the forward signal on the transmission path. The feedback loop produces a feedback signal from the forward signal and a reflected signal present on the transmission path. The feedback receiver generates forward signal samples and reflected signal samples from the feedback signal. The processor identifies a time delay from the forward signal samples and the reflected signal samples. In a further embodiment, the processor also calculates the physical location and/or the magnitude of the mismatch.

In one embodiment, the apparatus also includes a modulator, which produces an RF pulse and provides the RF pulse to the amplifier. The amplifier then amplifies the RF pulse to produce the forward signal. In a further embodiment, the amplifier, the feedback loop, the feedback receiver, and the processor are located within a communications base station.

DETAILED DESCRIPTION OF THE INVENTION

Figure 1:
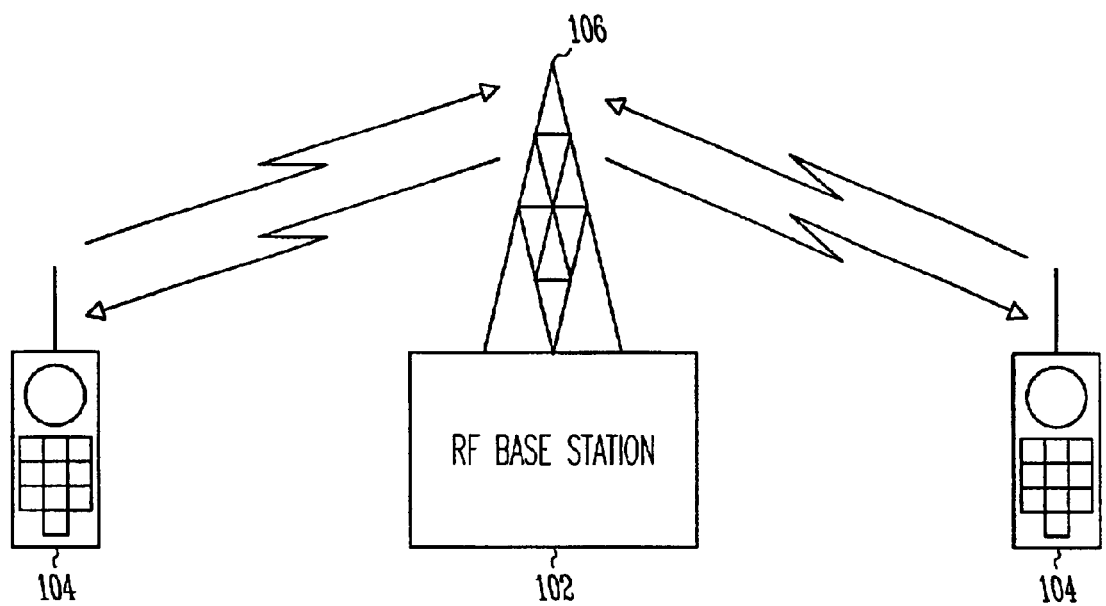
FIG. 1 is a simplified diagram of an RF communication system in accordance with one embodiment of the present invention.

FIG. 1 is a simplified diagram of an RF communication system in accordance with one embodiment of the present invention. The system includes one or more telecommunication base stations 102, which transmit and/or receive signals from one or more wireless communication devices 104, such as cellular telephones or radios, for example. Signals are transmitted and received at base station 102 via antenna 106.

Figure 2:
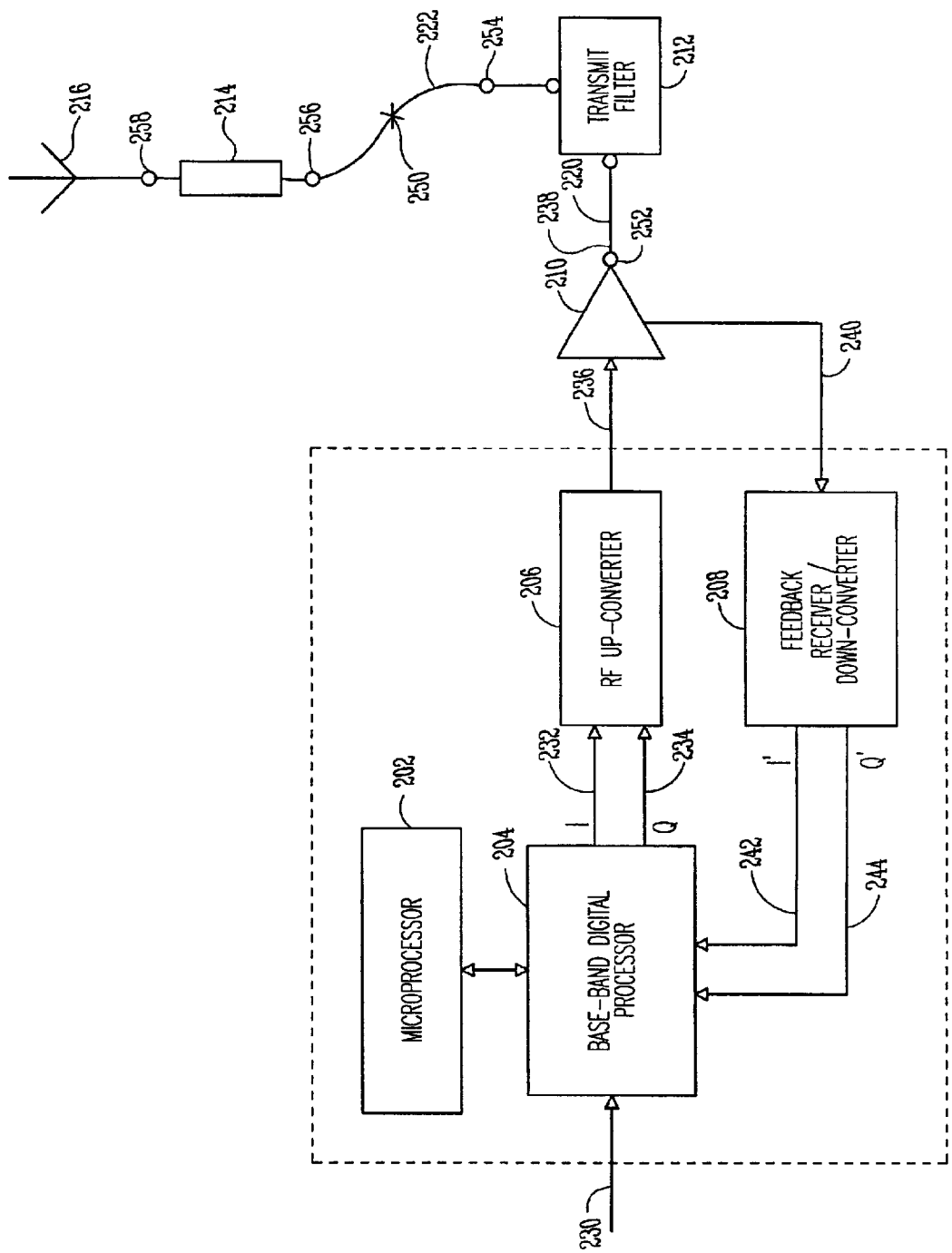
FIG. 2 is a simplified block diagram of a transmission subsystem in accordance with one embodiment of the present invention.

FIG. 2 is a simplified block diagram of a transmission subsystem within a base station in accordance with one embodiment of the present invention. The transmission subsystem includes microprocessor 202, base-band digital processor 204, RF up-converter 206, feedback receiver/down-converter 208, amplifier 210, transmit filter 212, lightning surge protector 214, antenna 216, and a transmission path that includes a number of transmission sections 220, 222.

During operations, base-band digital processor 204 receives digital base-band data 230 from a data source (e.g., a transmit channelizer). Processor 204 acts as a source of base-band digital data to the rest of the system, by converting the base-band data 230 into real (I) and imaginary (Q) data streams 232, 234.

The base-band data streams 232, 234 are provided to RF up-converter 206, which then produces an RE signal 236 from the data streams 232, 234. The RF signal 236 is provided to amplifier 210, which produces an amplified RE signal 238 that is transmitted over a transmission path between amplifier 210 and antenna 216. In one embodiment, the transmission path is a hardwired path that includes one or more connectors and one or more sections of coaxial cable (e.g., 50 Ω RE transmission cable). Although the term "amplifier" is used herein, the term could mean a power amplifier or a final gain stage of the transmitter, in various embodiments. Along the transmission path, transmit filter 212 is used to condition the RF signal 238 prior to transmission.

The amplified signal 238 also is fed back, as feedback signal 240, to feedback receiver/down-converter 208. Feedback receiver 208 down-converts feedback signal 240 back into the base-band. In one embodiment, which will be described further in conjunction with FIG. 6, receiver 208 produces I' and Q' signals, which are sampled and delivered to base-band digital processor 204, as indicated by I' and Q' data streams 242, 244. In another embodiment, which will be described further in conjunction with FIG. 7, receiver 208 simply mixes down to an intermediate frequency (IF) for sampling by an ADC, and provides only a single, digitized IF output to processor 204. Processor 204 then converts that signal to I' and Q'. Accordingly, in that embodiment, signals 242 and 244 are replaced by a single IF signal.

At times, one or more problems may exist along the transmission path, which result in significant impedance mismatches. These impedance mismatches can dramatically affect the quality of the transmitted signal. For example, assume section 222 of the transmission path includes coaxial cable or some other type of wired connection. At point 250, the cable could be damaged or cut, which could result in a significant impedance mismatch. In the case of a short, the RF voltage at the short's location would be zero, and it would not be possible to detect any mismatches after that point. In order to repair the cable, it is necessary to determine the location of the mismatch.

As described previously, prior art systems require normal transmissions to be interrupted while external equipment is attached along the transmission path in order to locate the impedance mismatch. In contrast, embodiments of the present invention do not require external equipment for locating mismatches. Instead, embodiments of the present invention use architectures incorporating a feedback receiver to provide a way to assess the integrity of the RF transmission path from the RF output (e.g., the output of amplifier 210) to and including the antenna 216. This enables an operator to identify any significant impedance mismatches within the RF path and to approximate the location of the fault without the use of external equipment. The operator, therefore, will not be required to disconnect any cables or connectors in order to diagnose the fault, and thus impact to the system is significantly reduced.

When an impedance mismatch is present, a significant portion of the forward signal is reflected back toward amplifier 210, resulting in a reflected signal that is a delayed and attenuated version of the forward signal. In accordance with various embodiments of the present invention, a feedback loop and switch within the amplifier 210 or near the amplifier's output detects both the forward and reflected signals, and provides them as feedback signal 240. Samples of the forward and reflected signals are used to determine a time delay between the forward signal and any significant reflection. The time delay is then used to identify the location of the impedance mismatch along the transmission path.

Figure 3:
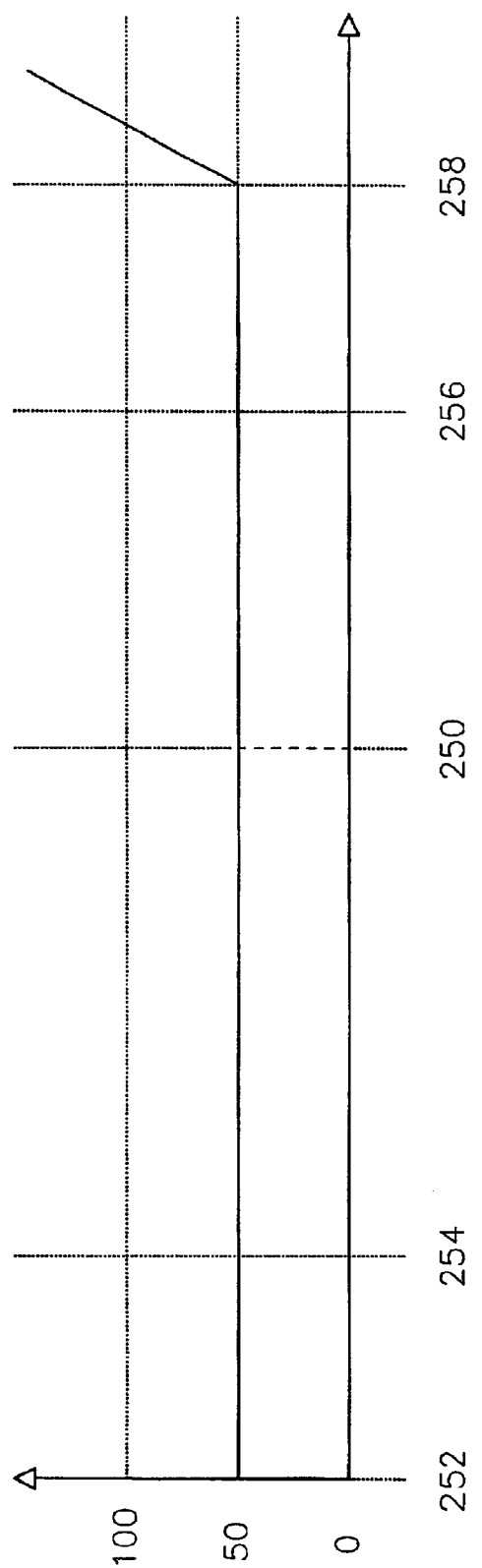
FIG. 3 is an example of a graph plotting impedance versus position along a transmission path in accordance with one embodiment of the present invention.

FIG. 3 is an example of a graph plotting impedance versus position along a transmission path in accordance with one embodiment of the present invention. Referring also to FIG. 2, assume the transmission path, which includes sections 220 and 222, has an ideal impedance profile. The graph illustrates that, in such a case, the impedance is constant at points 252, 254, 250, 256, and 258. If, for example, an RF short exists at point 250, the RF voltage at that point would drop to zero, as indicated by the dashed vertical line, and it would be impossible to detect a mismatch after that point (i.e., at any point between 250 and 258). As will be described in detail below, the method and apparatus of the various embodiments can be used to determine the location of the impedance mismatch (e.g., the number of meters between point 252 and 250).

Figure 4:
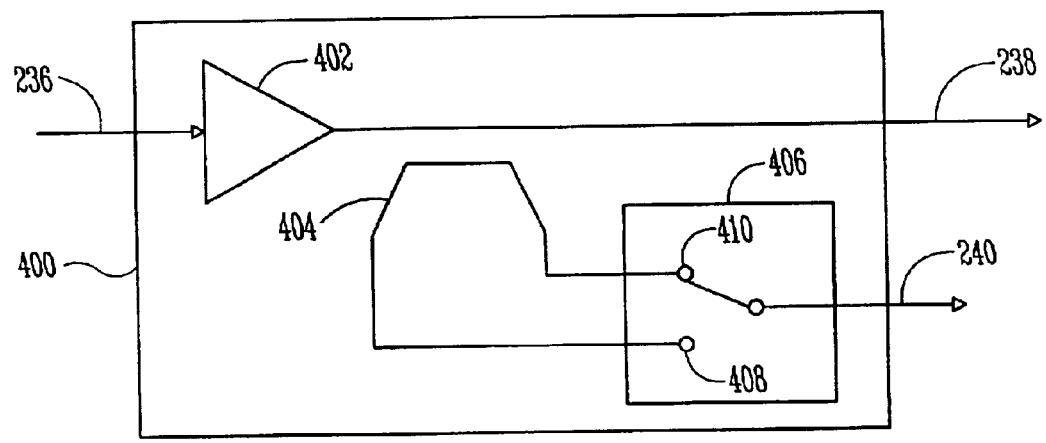
FIG. 4 is a schematic diagram of an amplifier and feedback loop in accordance with one embodiment of the present invention.

FIG. 4 is a schematic diagram of an amplifier 400, which includes a feedback loop in accordance with one embodiment of the present invention. For example, amplifier 400 could be used in the system of FIG. 2 as amplifier 210. When integrated into a transmission system such as that depicted in FIG. 2, amplifier 402 is a power amplifier or the final gain stage of the transmitter. Accordingly, amplifier 402 receives an RF signal 236 and produces an amplified RF signal 238, which is transmitted along a transmission path.

At or near the output of amplifier 402, a feedback loop captures both the forward signal 236 and a reflection of the forward signal. The feedback loop includes a directional coupler 404 and a feedback selector switch 406, in one embodiment. The function of the feedback selector switch 406 is to select one of two signals to be fed back to feedback receiver/down-converter 208 (FIG. 2).

During normal operations, feedback selector switch 406 is set such that a sample of the forward signal 238 is delivered to receiver 208 (FIG. 2). In order to sample forward signal 238, the feedback selector switch is in a first position, making contact with a first terminal 408 of directional coupler 404. In this first position, a portion of the forward signal is captured and provided as feedback signal 240. In order to sample the reflected signal, feedback selector switch 406 is switched for a period of time to a second position, thus making contact with a second terminal 410 of directional coupler 404. In this position, a portion of the reflected signal is captured and provided as feedback signal 240. At the end of this period, the feedback selector switch is switched back to the first position. The feedback signal 240 is sent back to the feedback receiver 208 (FIG. 2), and further processing is performed, as will be described later.

In one embodiment, the reflected signal is sampled for a short time period, and normal transmissions continue while the reflected signal is sampled. For example, the reflected signal could be sampled for a period of time ranging from 100 to 500 milliseconds, although the signal could be sampled for a shorter or longer period of time, as well.

In another embodiment, normal operation of the RF transmitter is suspended for a certain period of time. During this time, a discrete RF pulse is delivered through the transmit path, and feedback selector switch 406 is set to channel a sample of the reflected signal back to feedback receiver 208 (FIG. 2). This embodiment will be described in detail in conjunction with FIGS. 8–12.

Figure 5:
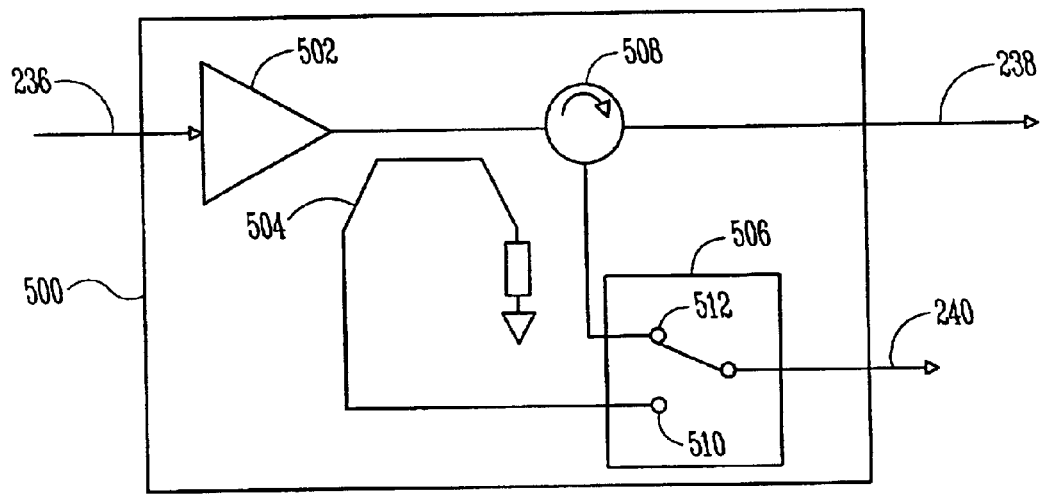
FIG. 5 is a schematic diagram of an amplifier and feedback loop in accordance with another embodiment of the present invention.

FIG. 5 is a schematic diagram of an amplifier 500, which includes a feedback loop in accordance with another embodiment of the present invention. For example, amplifier 500 could be used in the system of FIG. 2 as amplifier 210. Similar to the amplifier described in conjunction with FIG. 4, amplifier 502 receives an RF signal 236 and produces an amplified RF signal 238, which is transmitted along a transmission path.

At or near the output of amplifier 502, a feedback loop captures both the forward signal 236 and a reflection of the forward signal. The feedback loop includes a directional coupler 504, a feedback selector switch 506, and an RF circulator 508, in one embodiment. The function of the feedback selector switch 506 is to select one of two signals to pass to the feedback receiver 208 (FIG. 2).

In order to sample forward signal 238, the feedback selector switch is in a first position, making contact with a first terminal 510 of directional coupler 504. In this first position, a portion of the forward signal is captured and provided as feedback signal 240. During a period of time, the feedback selector switch is switched, as shown in FIG. 3, to a second position, making contact with a second terminal 512, which connects to RF circulator 508. In this position, a portion of the reflected signal is captured and provided as feedback signal 240. At the end of this period, the feedback selector switch is switched back to the first position. The feedback signal 240 is send back to the feedback receiver 208 (FIG. 2), and further processing is performed, as will be described later.

As was described in conjunction with FIG. 4, in one embodiment, nornal transmissions are continued while the reflected signal is sampled. In another embodiment, normal transmissions are suspended while an RF pulse is delivered through the transmission path and the reflected signal is sampled. Both of these embodiments will be described in more detail later.

Referring to both FIGS. 4 and 5, the RF coupler 404, 504 and/or feedback switch 406, 506, and/or RF circulator 508 can be integral parts of amplifier 210 (FIG. 2), or some or all of these components of the feedback loop can be distinct from amplifier 210. In addition, in one embodiment, feedback selector switch 406, 506 is a software controlled switch, although switch 406, 506 could be hardware controlled in another embodiment.

Referring again to FIG. 2, feedback receiver/down-converter 208 receives the feedback signal 240 from amplifier 210 (e.g., amplifier 400, 500, FIGS. 4, 5). As explained previously, during normal operations, feedback signal 240 represents a sample of the forward signal 238. When it is desired to sample the reflected signal in order to diagnose an impedance mismatch, the feedback loop within amplifier 210 is switched for a period of time so that feedback signal 240 represents a sample of the reflected signal.

Figure 6:
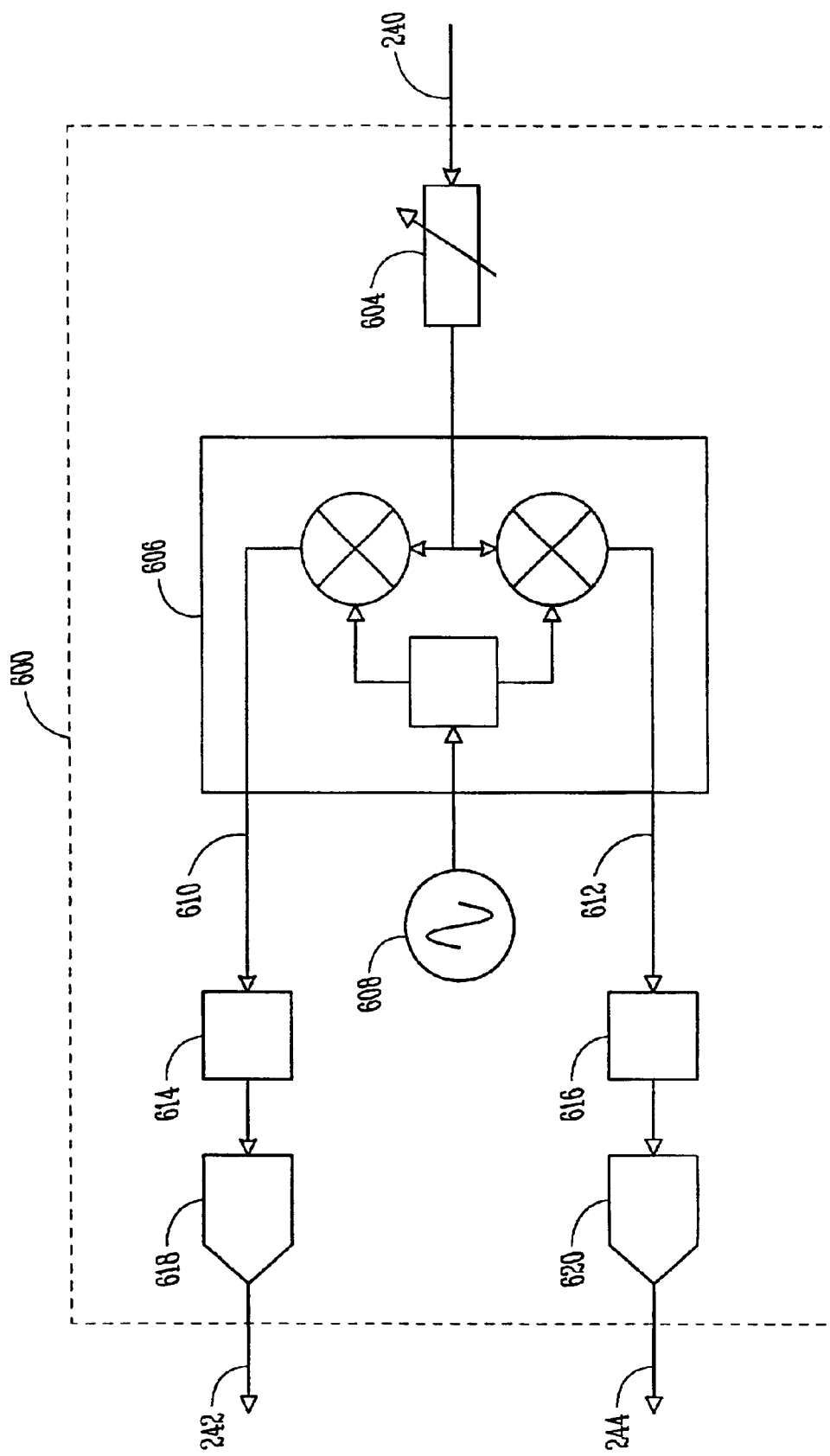
FIG. 6 is a schematic diagram of a feedback receiver/down-converter in accordance with one embodiment of the present invention.
Figure 7:
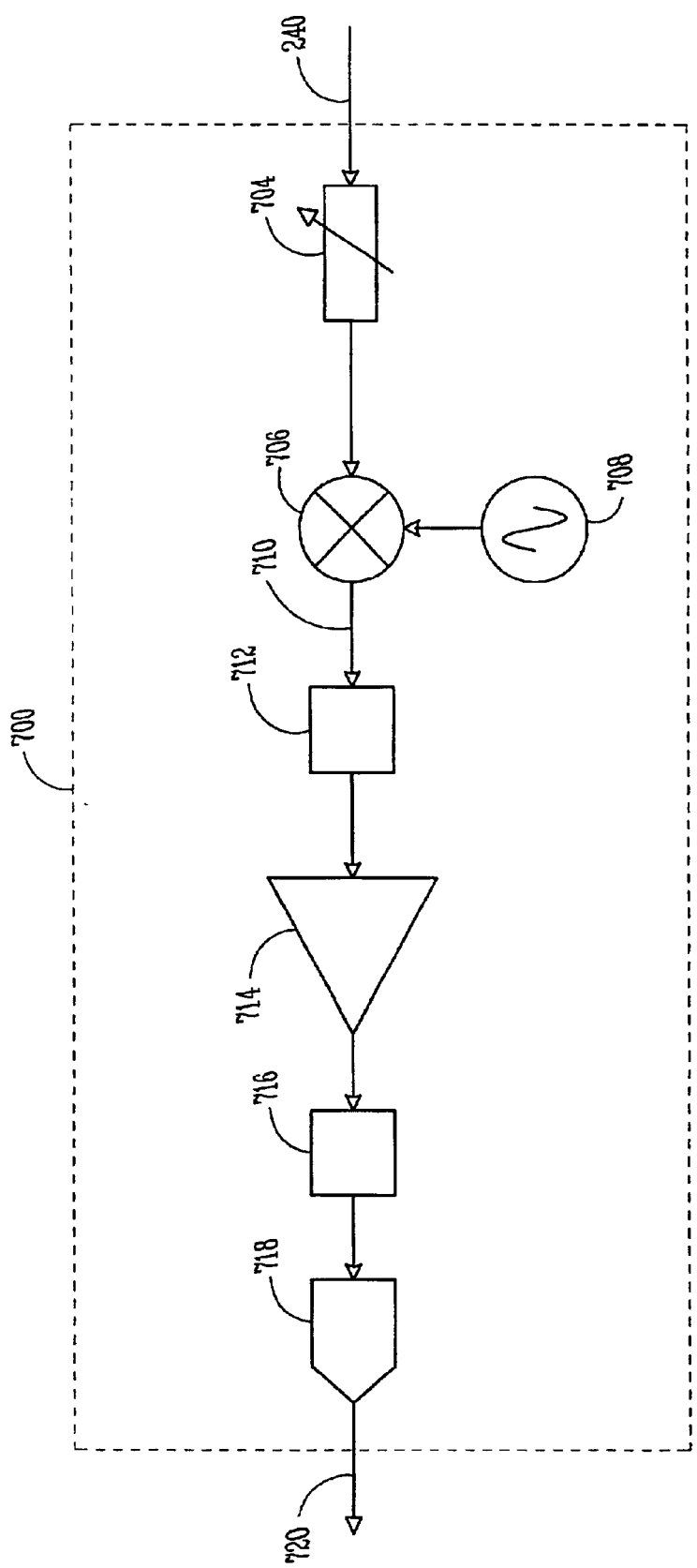
FIG. 7 is a schematic diagram of a feedback receiver/down-converter in accordance with another embodiment of the present invention.

FIGS. 6 and 7 illustrate two embodiments of feedback receiver/down-converter 208. In one embodiment, which will be described in detail, below in conjunction with FIG. 6, receiver 208 outputs I' and Q' signals (e.g., signals 242, 244) to processor 204. In another embodiment, which will be described in detail, below in conjunction with FIG. 7, receiver 208 simply mixes down to an intermediate frequency (IF) for sampling by an ADC, and provides only a single, digitized IF output to processor 204. Processor 204 then converts that signal to I' and Q'. Accordingly, in that embodiment, signals 242 and 244 are replaced by a single IF signal.

FIG. 6 is a schematic diagram of a feedback receiver/down-converter 600 (e.g., receiver 208, FIG. 2) in accordance with one embodiment of the present invention. Receiver 600 includes attenuator 604, demodulator 606, frequency generator 608, low pass filters 614, 616, and analog-to-digital converters (ADC) 618, 620, in one embodiment.

Receiver 600 receives a sampled RF waveform 240, which represents a feedback signal from amplifier 210 (FIG. 2). The waveform 240 is then attenuated by attenuator 604. In one embodiment, attenuator 604 is a digitally controlled, variable attenuator.

The attenuated signal is then manipulated by demodulator 606 to produce down-converted, analog I' and Q' waveforms 610, 612. In one embodiment, demodulator 606 is an RF to base-band I/Q demodulator. The level of down-conversion is based on the frequency generated by frequency generator 608. These waveforms 610, 612 are then filtered by low pass filters 614, 616, and converted to digital I' and Q' data streams 242, 244 by ADCs 618, 620. As described previously in conjunction with FIG. 2, these signals 242, 244 are then provided to processor 204.

FIG. 7 is a schematic diagram of a feedback receiver/down-converter 700 in accordance with another embodiment of the present invention. This receiver 700 could be used in place of receiver 208 (FIG. 2). Receiver 700 includes attenuator 704, mixer 706, frequency generator 708, band pass filter 712, amplifier 714, anti-alias filter 716, and ADC 718, in one embodiment.

Receiver 700 receives a sampled RF waveform 240, which represents a feedback signal from amplifier 210 (FIG. 2). The waveform 240 is then attenuated by attenuator 704. In one embodiment, attenuator 704 is a digitally controlled, variable attenuator.

The attenuated signal is then mixed by mixer 706 to produce down-converted, analog waveform 710. In one embodiment, mixer 706 down-converts the RF waveform to an intermediate frequency (IF). The level of down-conversion is based on the frequency generated by frequency generator 708. In one embodiment, frequency generator 708 produces a frequency equal to the transmit center frequency plus the desired IF frequency.

The waveform 710 is then filtered by band pass filter 712, amplified by IF amplifier 714, and filtered again by anti-alias filter 716. The resulting analog waveform is then converted into a digital data stream 720 by ADC 718. In contrast to the embodiment illustrated and described in conjunction with FIG. 2, receiver 700 (e.g., used in place of receiver 208, FIG. 2) provides only a single, digitized IF output to processor 204. In this embodiment, processor 204 then digitally implements a demodulator, and converts the output signal from feedback receiver 208 into I' and Q'. Accordingly, in this embodiment, signals 242 and 244 (FIG. 2) are replaced by a single IF signal.

Referring again to FIG. 2, the output of feedback receiver 208 (e.g., receiver 600, FIG. 6 or receiver 700, FIG. 7) is captured by base-band digital processor 204. In one embodiment, during the period of time that the reflected signal is being sampled by amplifier 210, a complex, digital representation of the outputs 242, 244 of the feedback receiver over time, I'(t) and Q'(t), is captured by processor 204, where t is the sample number. In addition, processor 204 captures corresponding samples of the digital outputs 232, 234 of processor 204 over time, I(t) and Q(t). In another embodiment, where normal transmissions are suspended and an RF pulse is delivered through the system, only the real portion, I'(t), of the output 242 of the feedback receiver is captured, as Q is not used for the RF pulse. In an alternate embodiment, the RF pulse could be complex, and both I'(t) and Q'(t) could be captured.

In one embodiment, processor 204 then analyses the captured data to identify the time delays of any significant reflections. Basically, each time delay is a time difference between a point along the reflected signal where a significant reflection is present and a corresponding point along the forward signal.

In one embodiment, which will be described in more detail in conjunction with FIG. 13, identifying a time delay involves processor 204 applying a correlation function to the forward signal samples and the reflected signal samples. From the output of the correlation function, processor 204 determines those points (if any) where the correlation function exceeds a threshold value. Processor 204 then identifies the time delays as the number of samples corresponding to each point where the correlation function exceeds the threshold value. In another embodiment, processor 204 identifies a time delay by determining a point where a magnitude of the reflected signal samples exceeds a threshold value, and identifying the time delay as a number of samples corresponding to the point where the magnitude exceeds the threshold value.

From each time delay, processor 204 determines a physical location of the impedance mismatch along the transmission path. In one embodiment, this is achieved by processor 204 first calculating a voltage gain between the forward signal and the reflected signal at a point that corresponds to the time delay. Processor 204 then determines whether the voltage gain exceeds a nominal range of values. If the voltage gain does exceed the nominal range, processor 204 determines the physical location based on the time delay and a propagation velocity of the forward signal through the transmission path. Processor 204 also can determine a magnitude of the impedance mismatch based on the voltage gain, the loss profile of the transmission path, the propagation velocity, and the time delay. Again, these processes are described in more detail in conjunction with FIG. 13.

As described previously, in one embodiment, normal transmissions are suspended while a discrete RF pulse is sent along the transmission path. The reflection of this discrete pulse is sampled, and time delays associated with any significant impedance mismatches are calculated, along with the locations and magnitudes of those mismatches. In one embodiment, the discrete RF pulse is generated by a modulator inside RF up-converter 206 (FIG. 2).

Figure 8:
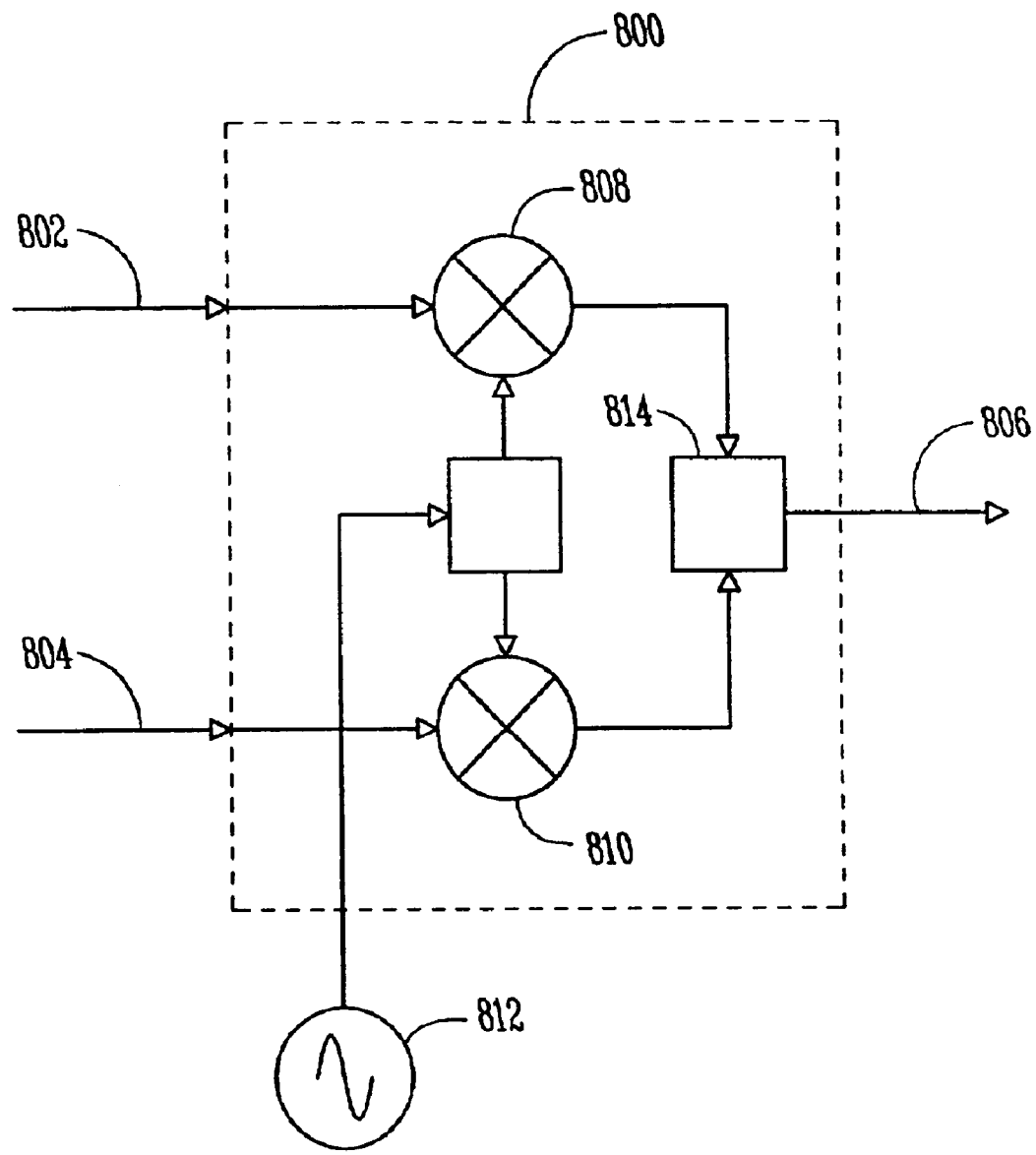
FIG. 8 is a schematic diagram of a modulator in accordance with one embodiment of the present invention.

FIG. 8 is a schematic diagram of a modulator in accordance with one embodiment of the present invention. Modulator 800 receives I and Q input stimulus waveforms 802, 804, and outputs an RF signal 806. Each input waveform 802, 804 is up-converted, in combiners 808, 810, respectively, by modulating the waveforms with a signal generated by frequency generator 812. The modulated waveforms are then added, in block 814, resulting in a discrete RF signal 806.

In one embodiment, the I stimulus waveform 802 is a discrete square pulse, and the Q stimulus waveform 804 is zero (no stimulus). Accordingly, the RF output waveform 806 is a discrete RF pulse. Examples of these waveforms are illustrated in FIGS. 9–11.

Figure 9:
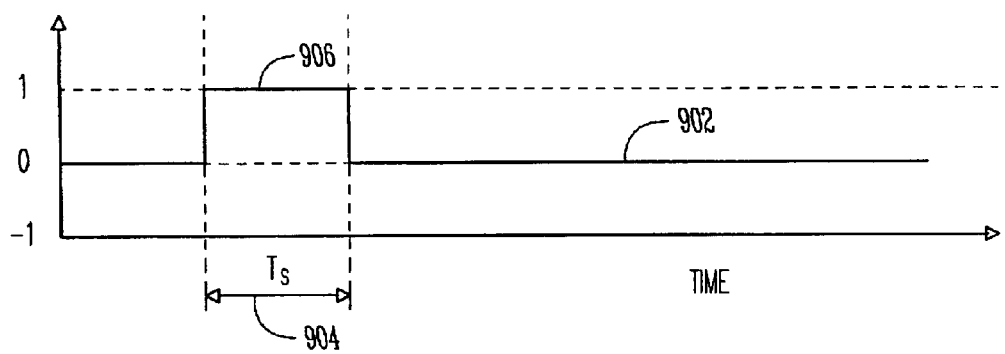
FIG. 9 is a graph plotting voltage versus time of an example of an I stimulus waveform in accordance with one embodiment of the present invention.

FIG. 9 is a graph plotting voltage versus time of an example of an I stimulus waveform 902 in accordance with one embodiment of the present invention. Waveform 902 has a zero value, except that during a portion of time 904, indicated at Ts, waveform 902 has a high value 906. Accordingly, waveform 902 is a square pulse.

Figure 10:
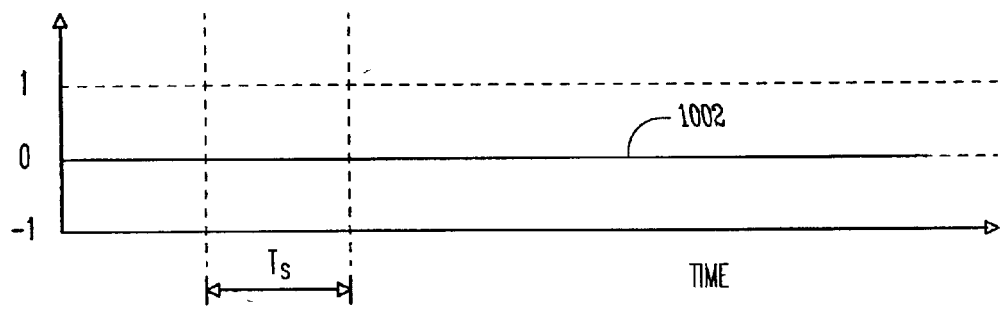
FIG. 10 is a graph plotting voltage versus time of an example of a Q stimulus waveform in accordance with one embodiment of the present invention.

FIG. 10 is a graph plotting voltage versus time of an example of a Q stimulus waveform 1002 in accordance with one embodiment of the present invention. In this embodiment, the Q stimulus waveform has a zero value, even during the time, Ts, when the I stimulus waveform is high.

Figure 11:
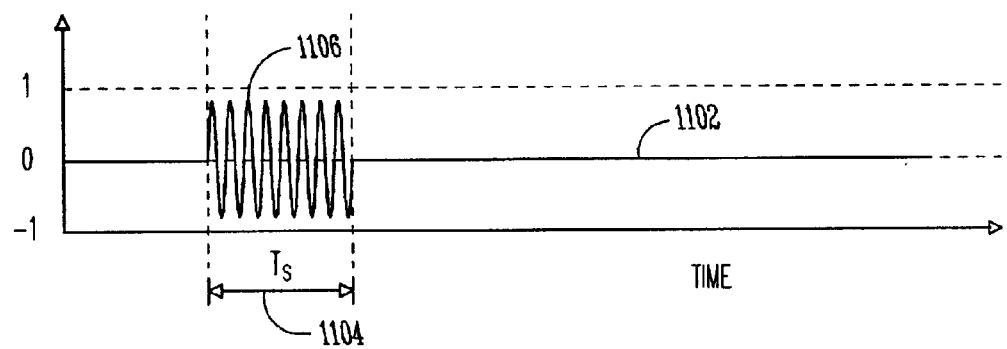
FIG. 11 is a graph plotting voltage versus time of an example of an RF output in accordance with one embodiment of the present invention.

FIG. 11 is a graph plotting voltage versus time of an example of an RF output 1102 in accordance with one embodiment of the present invention. As explained previously, RF output waveform 1102 is an up-converted combination of waveforms 702 and 802 (FIGS. 9, 10). Accordingly, waveform 1102 includes a discrete RF pulse 1106 during the time 1104, Ts, when the I stimulus waveform 702 (FIG. 9) is high. This discrete RF pulse 1106 is sent through the transmission path in order to detect reflections that indicate impedance mismatches. In other embodiments, the Q stimulus waveform could be a square pulse as well, or different types of pulses or waveforms could be used for either or both the I and Q stimulus waveforms.

Figure 12:
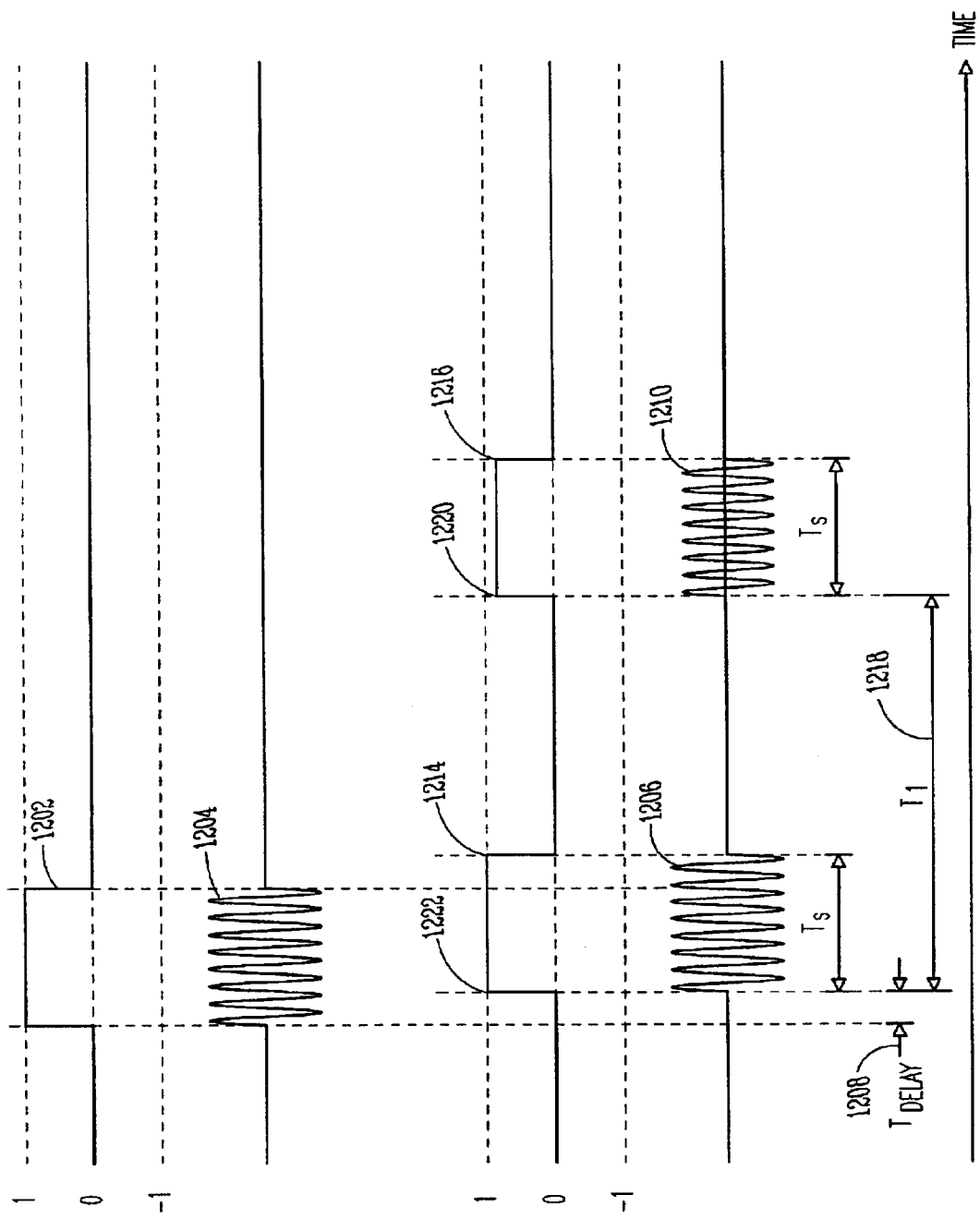
FIG. 12 is a graph plotting voltage versus time of an example of a reflected waveform with respect to a stimulus waveform in accordance with one embodiment of the present invention.

FIG. 12 is a graph plotting voltage versus time of an example of a reflected rZ waveform with respect to a stimulus waveform in accordance with one embodiment of the present invention. Waveform 1202 represents an I stimulus waveform (e.g., waveform 702, FIG. 9) provided to a modulator (e.g., modulator 600, FIG. 8). The I stimulus waveform 1202 results in a discrete RF pulse 1204 at the output of the modulator. The duration of the pulse 1204 is Ts.

Pulse 1204 is amplified and transmitted as a forward signal on the transmission path (e.g., 220, 212, 222, 214, 216, FIG. 2). The amplifier (e.g., amplifier 210, FIG. 2) samples the forward signal, which is represented by pulse 1206. Pulse 1206 is delayed from pulse 1204 by a value indicated by $T_{delay}$ 1208, due to the amount of time necessary for pulse 1204 to propagate from the modulator through the amplifier.

The feedback receiver is then switched to sample the reflected signal from the transmission path. If a significant impedance mismatch is present, the reflected signal can look like RF pulse 1210, which basically is an attenuated and delayed version of pulse 1206. At the output of the feedback receiver/down-converter (e.g., receiver/down-converter 208, FIG. 2), the forward and reflected waveforms again represent square pulses, as indicated by pulses 1214, 1216. The time delay 1218, Ti, between pulses 1214 and 1216 is the time difference between a point along the reflected signal where a significant reflection is present (e.g., point 1220) and a corresponding point along the forward signal (e.g., point 1222).

The location of the mismatch can be approximated from the time taken for the reflected RF stimulus waveform to be detected by the feedback receiver. A more accurate distance approximation can be made if the propagation velocities of the various RF transmit path elements are known. In addition, the magnitude of the mismatch can be approximated if the losses in the various transmission elements are known.

Figure 13:
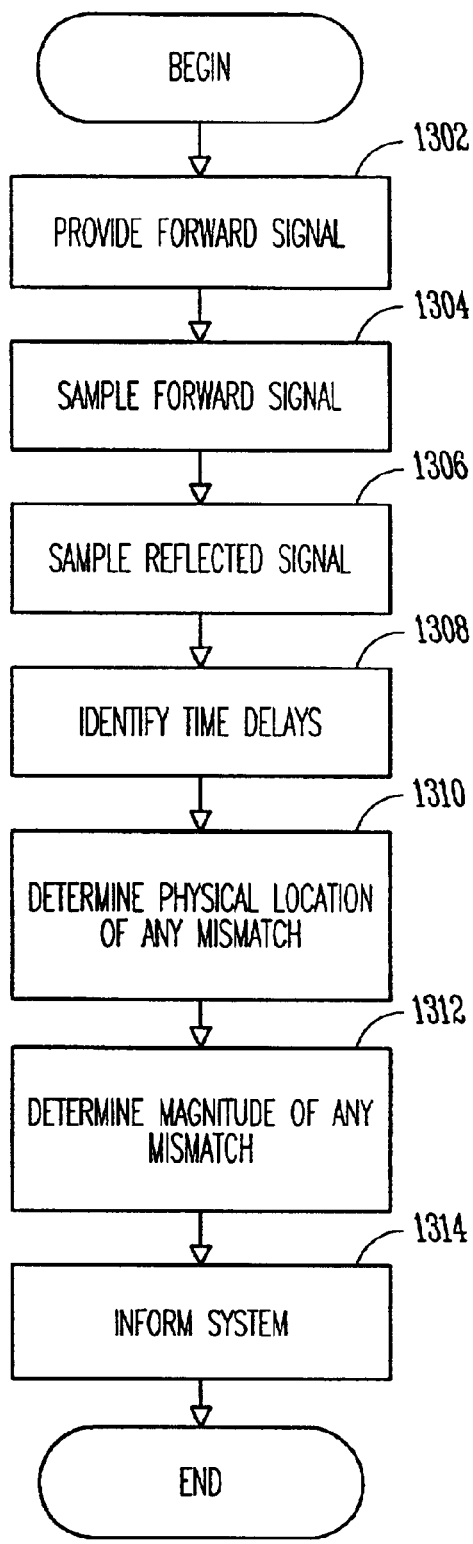
FIG. 13 is a flowchart of a method for estimating the location of an impedance mismatch along a transmission path in accordance with one embodiment of the present invention.

FIG. 13 is a flowchart of a method for estimating the location and magnitude of an impedance mismatch along a transmission path in accordance with one embodiment of the present invention. The method begins, in block 1302, by providing a forward signal through the transmission path. In one embodiment, the forward signal is the same as the normally transmitted signal. In another embodiment, normal transmissions are suspended, and a stimulus waveform, such as a discrete RF pulse, is transmitted through the transmit path.

In block 1308, one or more time delays are identified from the data. In one embodiment, the data includes I and Q waveform samples. Basically, a time delay corresponds to a time difference between a point along the reflected signal where a significant reflection is present and a corresponding point along the forward signal.

In one embodiment, the time delays are identified by first applying a sliding correlation function to the forward signal samples and the reflected signal samples. For example, the inputs to the correlation function can be ([I(t−τ)]+[Q(t−τ)]) and ([I'(t)]+[Q'(t)]), where t is a sample number, τ is a delay value, I(t−τ) represents a delayed real sample of the forward signal, Q(t−τ) represents a delayed imaginary sample of the forward signal, I'(t) represents a real sample of the reflected signal, and Q'(t) represents an imaginary sample of the reflected signal.

Next, the output of the correlator function is processed to determine any points here the correlation function exceeds a threshold value. A time delay is identified as the number of samples, τ, corresponding to the point where the correlation function exceeds the threshold value. The threshold value is employed to inhibit false detections from occurring. The values of rare stored in memory.

In another embodiment, where the forward signal is represented in the I domain by a discrete RF pulse, a correlation function is not used. Instead, a function that is proportional to the reflected power is generated as follows:

(1) $P_r(\tau) = \sqrt{I'(\tau)^{2} + Q'(\tau)^{2}}$.

Identifying the time delays is performed by determining any points where a magnitude of the reflected signal power samples exceeds a threshold value, $P_{thresh}$. The threshold value is employed to inhibit false detections from occurring. Values of τ are identified where $P_r(\tau) > P_{thresh}$. A time delay, τ, is identified as the number of samples between the input stimulus pulse and the point where the reflected signal exceeds the threshold value, where τ is the number of samples after the stimulus pulse. The values of rare stored in memory.

After identifying a time delay, τ, the physical location of the corresponding impedance mismatch along the transmission path is determined, in block 1310. The physical location is determined differently, depending on whether a sliding correlator function or the magnitude of the reflection was used to identify the time delays. If a sliding correlator function is used, the location is determined by first calculating a voltage gain between the forward signal and the reflected signal at points that correspond to the time delays. A function that is proportional to the complex voltage gain versus delay, $G(\tau)$, is estimated from the following equation:

(2) $G(\tau)*(I(t−\tau)+jQ(t−\tau))=I'(t)+jQ'(t)$.

$G(\tau)$ is solved for all desired values of τ in the least squares sense. The use of singular value decomposition is a preferred method to solve over-determined systems of equations in the presence of additive white Gaussian noise.

In one embodiment, adaptive algorithms such as least mean square (LMS) or recursive least squares (RLS) may be employed in a point-by-point implementation, such that samples of the forward and reflected power over time are not required to be captured and processed.

The estimated gain is enumerated for all values of τ at which reflections were detected by the sliding correlator function. These gain values are stored against their respective values of τ. Next, the magnitude of Gv(τ) for τ=0 is examined. A nominal range of values is expected for cases where the RF transmission path has no significant mismatches. This is due to a combination of the limited directivity of the reverse RF signal sampling apparatus (e.g., a directional coupler 404, FIG. 4 or RF circulator 508, FIG. 5), and the limited isolation of the feedback selector switch (e.g., switch 406, 506, FIGS. 4, 5). A value that is outside the established nominal range of values indicates that a mismatch is present close to the RF output of the power amplifier (e.g., amplifier 210, FIG. 2) or final gain stage. In such a case, the estimated magnitude of the mismatch is calculated, along with an indication that the mismatch is close to the RF output of the amplifier or final gain stage. A calibration procedure, similar to that which is performed with a network analyzer (e.g., applying an RF matched load and short circuit standard), could be employed to further enhance the accuracy of this process, thereby defining the aforementioned "nominal range of values" for the particular system under evaluation.

For the case where the magnitude of Gv(τ) for τ=0 is within the nominal range of values, then a further algorithm is used to continue to process Gv(τ) for all of the stored values of τ. If no values of τ were stored, then no significant mismatch was detected, and no further processing or action is performed.

For the case where Gv(τ) for τ=0 is within the nominal range, and one or more values of t were stored, then further calculations are performed to estimate the magnitudes and/or locations of the mismatches. Further processing could occur within the same processor (e.g., processor 204, FIG. 2), or could be passed to other base station system software. Alternatively, the further processing could occur in an element of the system other than the base station.

In another embodiment, if time delays are identified as reflections whose power magnitudes exceed a certain threshold, $P_{thresh}$, rather than using a sliding correlator function, then the physical location of the impedance mismatch is determined by first calculating a magnitude of the reflected signal at points that correspond to the time delays. Calibration is performed to correct for losses of the feedback path, in one embodiment. Calibration data is then used to generate $Gv(\tau)$, which is a scalar estimation of the voltage gain between the output of the amplifier (e.g., amplifier 210, FIG. 2) or the final gain stage and the input to the feedback receiver (e.g., receiver 208, FIG. 2) over time. $Gv(\tau)$ is enumerated for all recorded values of $\tau$ that are related to the detected mismatches.

As with the previously described embodiment, a nominal range of values is expected for cases where the RF transmission path has no significant mismatches. For $Gv(\tau)$ where $\tau=0$, a value that is outside of the established nominal range of values indicates that a mismatch is present close to the RF output of the power amplifier (e.g., amplifier 210, FIG. 2) or final gain stage. For the case where $Gv(\tau)$ for $\tau$ is within the nominal range of values, then a further algorithm is used to continue to process $Gv(\tau)$ for all of the stored values of $\tau$. If no values of $\tau$ were stored, then no significant mismatch was detected, and no further processing or action is performed.

For the case where $Gv(\tau)$ for $\tau=0$ is within the nominal range, and one or more values of t were stored, then further calculations are performed to estimate the magnitudes and/or locations of the mismatches. As described previously, the further processing could occur within the same processor (e.g., processor 204, FIG. 2), or could be passed to other base station system software. Alternatively, the further processing could occur in an element of the system other than the base station.

After determining the complex or simple voltage gain, the physical location of any detected mismatch is determined based on the time delay and a propagation velocity of the forward signal through the transmission path. In one embodiment, the physical location is determined by applying the following formula:

(3) physical location=$((v_{prop}*\tau)/2*N)$ meters, where $v_{prop}$ is the propagation velocity, $\tau$ is the time delay, and N is a sampling rate. This equation assumes a uniform propagation velocity profile throughout the transmission path (e.g., the transmit filter 212, FIG. 2, has the same propagation velocity as coaxial cables 238, 222 and other elements), prior to the mismatch. In addition, the equation assumes that the sample rate, N, is the same for the transmitter and the feedback receiver. In other embodiments, the equation could be modified to account for a non-uniform propagation velocity profile and/or a sampling rate that is different for the transmitter and feedback receiver.

Referring back to FIG. 13, in addition to determining the physical location of the impedance mismatch, the magnitude of the impedance mismatch also is determined, in one embodiment, in block 1312. This calculation is based on the voltage gain, a loss profile of the transmission path, the propagation velocity, and the time delay. In one embodiment, determining the magnitude involves determining a voltage standing wave ratio (VSWR) by applying the following formula:

$$VSWR = \frac{1 + G_v(\tau) + \sqrt{v_{prop}*\tau*L)/(2*N)}}{1 - G_v(\tau) + \sqrt{v_{prop}*\tau*L)/(2*N)}}, \quad (4)$$

where $\tau$ is the time delay, $G_v(\tau)$ is the voltage gain, $V_{prop}$ is the propagation velocity, L is the loss profile, and N is a sampling rate. This equation assumes a uniform propagation velocity profile and a uniform loss profile throughout the transmission path, prior to the mismatch. The equation also assumes that the sample rate, N, is the same for the transmitter and the feedback receiver. In addition, if the function $(Re(Gv(\tau))+Imag(Gv(\tau r)))$ were used, the function is converted into an approximate scalar voltage gain versus delay function, $Gv(\tau)/dB$, between the amplifier or final gain stage and the feedback receiver, by calibrating the feedback loop. In other embodiments, the equation could be modified to account for a non-uniform propagation velocity or loss profile and/or a sampling rate that is different for the transmitter and feedback receiver.

The system is then informed of the location and magnitude of the mismatch, in block 1312, and the method ends. The system may then generate an alarm or other notification, and pass a system operator information, which enables the operator to repair or replace any damaged transmission elements in order to improve the system performance.

Various embodiments of an apparatus and method for determining the locations of impedance mismatches have been described. The various embodiments have been described in the context of determining impedance mismatches within an RF telecommunication base station. One of ordinary skill in the art would understand, based on the description herein, that the method and apparatus of the present invention could also be applied in many other applications where it is desirable to determine impedance mismatch locations, including other types of wired or wireless communication systems. Therefore, all such applications are intended to fall within the spirit and scope of the present invention.

In the foregoing detailed description, reference is made to the accompanying drawings, which form a part hereof, and in which are shown by way of illustration specific embodiments in which the invention may be practiced. These embodiments are described in sufficient detail to enable those skilled in the art to practice the invention.

It will be appreciated by those of ordinary skill in the art that any arrangement, which is calculated to achieve the same purpose as the embodiments of the present invention may be substituted for the specific embodiments shown. The foregoing detailed description is not to be taken in a limiting sense, and it will be readily understood by those skilled in the art that various changes in the details, materials, and arrangements of the parts and steps, which have been described and illustrated in order to explain the nature of this invention, may be made without departing from the sprit and scope of the invention as expressed in the adjoining claims.

What is claimed is:

1. A method for locating an impedance mismatch along a transmission path, the method comprising:

providing a forward signal through the transmission path;

obtaining, using a feedback loop which includes a feedback selector switch, forward signal samples and reflected signal samples from the forward signal and a reflected signal, respectively, wherein the reflected signal is a reflection of the forward signal from the transmission path; and identifying a time delay from the forward signal samples and the reflected signal samples, wherein the time delay is a time difference between a point along the reflected signal where a significant reflection is present and a corresponding point along the forward signal, wherein the forward signal is an RF pulse, and identifying the time delay comprises:

determining a point where a magnitude of the reflected signal samples exceeds a threshold value; and identifying the time delay as a number of samples between the RF pulse and the point where the magnitude of the reflected signal exceeds the threshold value.

2. The method of claim 1, wherein providing the forward signal comprises providing a discrete RF pulse through the transmission path.

3. The method of claim 1, wherein obtaining the forward signal samples and the reflected signal samples comprises:

switching the feedback selector switch to a first position to sample the forward signal; and switching the feedback selector switch to a second position to sample the reflected signal.

4. The method of claim 1, further comprising determining, from the time delay, a physical location of the impedance mismatch along the transmission path.

5. The method of claim 4, wherein determining the physical location of the impedance mismatch comprises:

calculating a voltage gain between the forward signal and the reflected signal at a point that corresponds to the time delay;

determining whether the voltage gain exceeds a nominal range of values; and if the voltage gain exceeds the nominal range, determining the physical location based on the time delay and a propagation velocity of the forward signal through the transmission path.

6. The method of claim 5, further comprising:

determining a magnitude of the impedance mismatch based on the voltage gain, a loss profile of the transmission path, the propagation velocity, and the time delay.

7. A method for locating an impedance mismatch along a transmission path, the method comprising:

providing a forward signal through the transmission path;

obtaining, using a feedback loop which includes a feedback selector switch, forward signal samples and reflected signal samples from the forward signal and a reflected signal, respectively, wherein the reflected signal is a reflection of the forward signal from the transmission path; and identifying a time delay from the forward signal samples and the reflected signal samples, wherein the time delay is a time difference between a point along the reflected signal where a significant reflection is present and a corresponding point along the forward signal, wherein identifying the time delay comprises:

applying a correlation function to the forward signal samples and the reflected signal samples;

determining a point where the correlation function exceeds a threshold value; and identifying the time delay as a number of samples corresponding to the point where the correlation function exceeds the threshold value.

8. A method for locating an impedance mismatch along a transmission path, the method comprising:

providing a forward signal through the transmission path;

obtaining forward signal samples and reflected signal samples from the forward signal and a reflected signal, respectively, wherein the reflected signal is a reflection of the forward signal from the transmission path;

correlating multiple samples of each of the forward and reflected signal samples to determine both a point along the reflected signal where a significant reflection is present and a corresponding point along the forward signal, wherein correlating multiple samples comprises applying a sliding correlation function to the multiple samples; and identifying a time delay between such points representative of a distance of the impedance mismatch along the transmission path.

9. The method of claim 8, wherein the correlation function is based on a least squares approach.

10. The method of claim 8, wherein the points are determined where the correlation function exceeds a threshold value.

11. The method of claim 8 and further comprising switching between obtaining samples of the forward and reflected signals.

* * * * *